(12) United States Patent
Ohkubo

(10) Patent No.: US 7,295,327 B2
(45) Date of Patent: Nov. 13, 2007

(54) MEASURING APPARATUS AND EXPOSURE APPARATUS HAVING THE SAME

(75) Inventor: Akinori Ohkubo, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 455 days.

(21) Appl. No.: 11/112,826

(22) Filed: Apr. 21, 2005

(65) Prior Publication Data

US 2005/0237540 A1    Oct. 27, 2005

(30) Foreign Application Priority Data

Apr. 21, 2004    (JP)    ............................. 2004-126049

(51) Int. Cl.
*G01B 11/02* (2006.01)
*G01B 9/02* (2006.01)

(52) U.S. Cl. ...................... 356/515; 356/521

(58) Field of Classification Search ........ 356/511–515, 356/521
See application file for complete search history.

(56) References Cited

U.S. PATENT DOCUMENTS

| | | | | |
|---|---|---|---|---|
| 5,835,217 | A | * | 11/1998 | Medecki ...................... 356/521 |
| 7,106,456 | B1 | * | 9/2006 | Cottrell ...................... 356/521 |
| 2007/0019175 | A1 | * | 1/2007 | Ohsaki et al. ................. 355/55 |

FOREIGN PATENT DOCUMENTS

JP      2004-055264    2/2004

OTHER PUBLICATIONS

U.S. Appl. No. 11/064,558, filed Feb. 24, 2005, Akinori Okhubo.
"Special Issue: Aiming at ultimate uses of optical technologies, measuring a wave font at ultimate uses" A copy of the reference and a translation of "2.1 PDI" of pp. 44-45 thereof are enclosed herewith as a concise explanation of the relevance. vol. 26, No. 1 O plus E, 2003.
Sekine, Y., et al. Wave front errors of reference spherical waves in high-numerical aperture point diffraction interferometers, J. Vac. Sci Technol. B22 (1) Jan./Feb. 2004.

* cited by examiner

*Primary Examiner*—Patrick Connolly
(74) *Attorney, Agent, or Firm*—Morgan & Finnegan LLP

(57) ABSTRACT

A measuring apparatus for measuring optical performance of a test optics by using light includes a first member for generating a first ideal wave front, a second member for generating a second ideal wave front and a test wave front that reflects the optical performance of the test optics, and a detector for detecting an interference fringe between the test wave front and the second ideal wave front that passes the second member, wherein the first member and/or the second member include a first membrane having a first aperture for diffracting the light, and a second membrane having a second aperture for diffracting the light that has passed the first aperture, the second membrane being spaced from the first membrane so that the first and second apertures overlap each other.

21 Claims, 20 Drawing Sheets

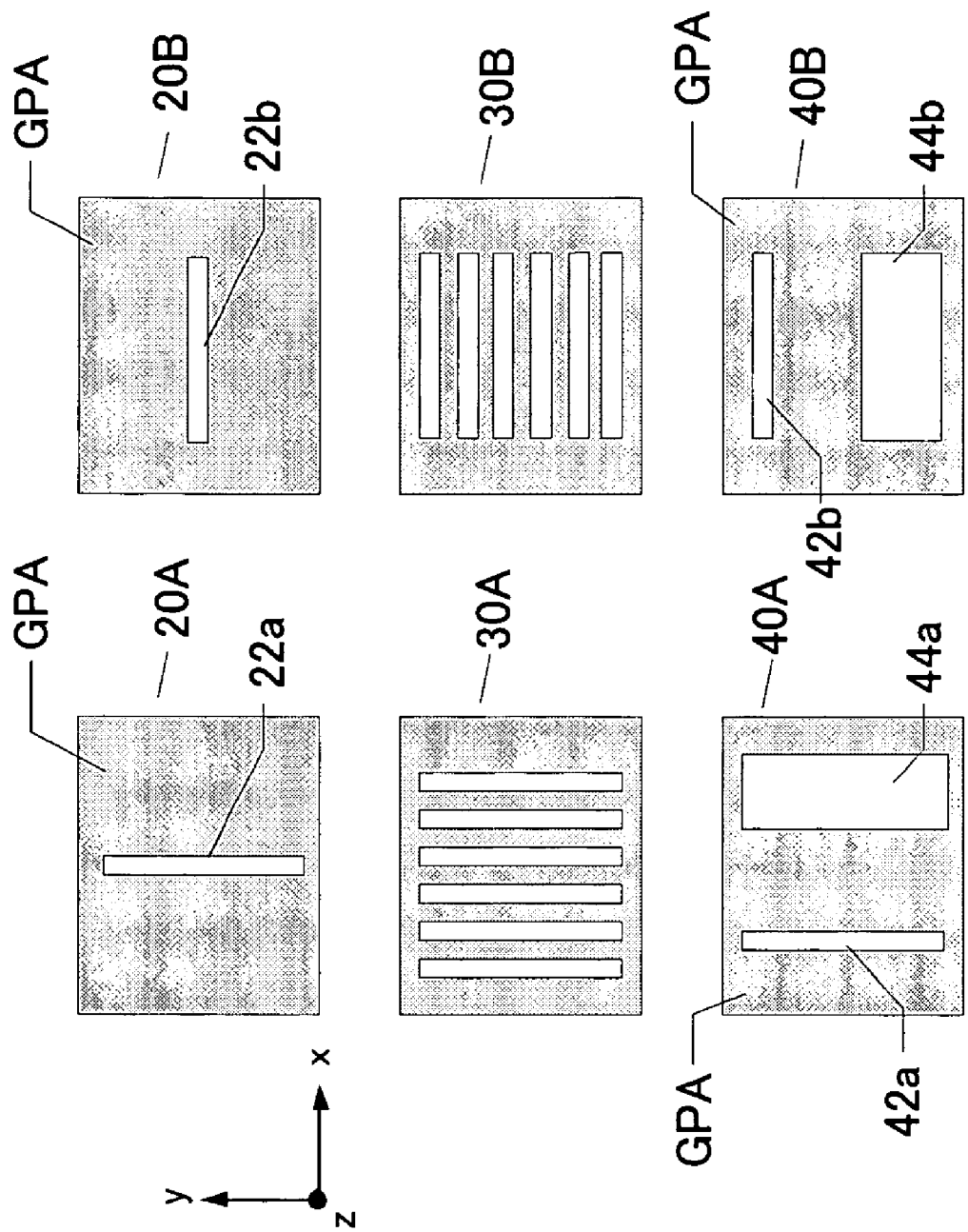

MEASURING APPARATUS AND EXPOSURE APPARATUS HAVING THE SAME

BACKGROUND OF THE INVENTION

The present invention relates generally to a measuring apparatus that measures the optical performance of an optical element, and more particularly to an exposure apparatus mounted with a measuring apparatus that measures a wave front aberration of a projection optical system that transfers a reticle pattern onto an object to be exposed.

A projection exposure apparatus has conventionally been used to transfer a circuit pattern of a reticle (or a mask) onto an object to be exposed in manufacturing such devices as semiconductor devices, e.g., an IC and a LSI, an image pickup devices, e.g., a CCD, display devices, e.g. a liquid crystal panel, and magnetic heads, in the photolithography process. Since this exposure apparatus needs to precisely transfer a reticle pattern onto a wafer at a predetermined magnification, it is important to use a precise projection optical system having good imaging performance and reduced aberration. In general, a value of a root mean square ("RMS") that indicates the precision of the optical system should be $\lambda/14$ or smaller in view of the Mareshal criterion, where $\lambda$ is a wavelength of a light source.

A catoptric optical system that includes n mirrors is used for an exposure apparatus that uses the extreme ultraviolet ("EUV") light with a wavelength of $\lambda$ of about 13.5 nm ("EUV exposure apparatus" hereinafter) and attempts to meet the recent demand for finer processing to the semiconductor device. Each mirror requires a shaping precision of $\lambda/(28\sqrt{n})$, and a six-mirror optical system needs a surface processing precision of about 0.2 nm RMS.

A conventional surface-precision measuring apparatus cannot measure such a highly precise surface shape due to its insufficient measuring precision. Accordingly, a measuring apparatus with such a high measuring precision as about 0.1 nm RMS has been proposed which utilizes a point diffraction interferometer ("PDI") that has a pinhole for generating an ideal spherical wave, and a line diffraction interferometer ("LDI") that has a slit for generating an ideal cylindrical or elliptical wave. See, for example, Katsuhiko Murakami, "O plus E", New Technology Communications, Inc., 2004 January, Vol. 26, No. 1, pp. 43-47.

In the measuring apparatus that uses the PDI and LDI for interference between a test wave front and a reference wave front generated from a fine aperture, such as the pinhole and slit, an error between the reference wave front and an ideal spherical or cylindrical wave, which error is referred to as a reference wave front deviation, affects a measuring error. The reference wave front deviation is caused by an optical axis offset or an offset between an optical axis of the incident light and an optical axis or center of the pinhole or slit. The optical axis offset causes the incident light to be shielded by the edge of the pinhole or slit, and disturbs the exited reference wave front. In addition, although a sufficiently small and thin pinhole or slit in a perfectly light-shielding member generates an ideal spherical or cylindrical wave, an actual pinhole or slit has a finite thickness and the generated wave front has a reference wave front deviation.

Therefore, it is necessary for the reduced reference wave front deviation to make a size of the aperture as small as possible and precisely align the center of the aperture with the optical axis of the incident light. Regarding the above influence, it is reported that a measuring error problematically increases when the wave front exited from the pinhole is calculated by changing the beam shift and the wave front aberration, and used as a reference wave front. See, for example, Y. Sekine, A. Suzuki, M. Hasegawa, H. Kondo, M. Ishii, J. Kawakami, T. Oshino, K. sugisaki, Y. Zhu, K. Otaki, Z. Liu, "Wave-front errors of reference spherical waves in high-numerical aperture point diffraction interferometers" J. Vac. Sci. Technol. B22(1) 2004.

The conventional interferometry uses a wavelength of the visible light, and does not require a high measuring precision, neglecting the influence of the reference wave front deviation on the measuring precision.

However, the projection optical system in the EUV exposure apparatus requires a highly precise measurement of the wave front aberration, and the influence of the reference wave front deviation on the measuring precision does not become negligible. In addition, the light having a small wavelength, such as the EUV light, leaks into a member that has a fine aperture, such as a light-shielding membrane, and the light leaking into the fine aperture disturbs the reference wave front similar to offsetting the optical axis. As the member that has the fine aperture is made thicker, the influence of the leakage into the fine aperture on the EUV light reduces. However, this scheme is contrary to the demand for a thinner aperture for an ideal spherical or cylindrical wave.

On the other hand, as disclosed in the above second reference, the influence on the measuring precision is non-negligible for the reference wave front emitted from the conventional fine aperture, since the beam shift etc. increase the wave front deviation. Therefore, a finer aperture that generates a reference wave front closer to the ideal spherical or cylindrical wave is preferable for the improved measuring precision.

Thus, the conventional measuring apparatus cannot precisely measure the aberration suitable for a highly precise optical system. In other words, the conventional measuring apparatus does not meet the measuring precision required for the highly precise optical system.

BRIEF SUMMARY OF THE INVENTION

The present invention is directed to a measuring apparatus, and an exposure apparatus having the same, wherein the measuring apparatus reduces an error between the ideal wave front and the reference wave front generated by the fine aperture, and precisely measures the optical performance, such as a wave front aberration, of an optical system.

A measuring apparatus according to one aspect of the present invention for measuring optical performance of a test optics by using light includes a first member for generating a first ideal wave front, a second member for generating a second ideal wave front and a test wave front that reflects the optical performance of the test optics, and a detector for detecting an interference fringe between the test wave front and the second ideal wave front that passes the second member, wherein the first member and/or the second member include a first membrane having a first aperture for diffracting the light, and a second membrane having a second aperture for diffracting the light that has passed the first aperture, the second membrane being spaced from the first membrane so that the first and second apertures overlap each other.

A measuring apparatus according to another aspect of the present invention for measuring optical performance of a test optics by using light includes a first member for generating a first ideal wave front, a second member for generating a second ideal wave front and a test wave front that reflects the optical performance of the test optics, and a detector for detecting an interference fringe between the test wave front and the second ideal wave front that passes the second member, wherein the first member and/or the second member include a first membrane having a first aperture for diffracting the light, a second membrane having a second aperture for diffracting the light that has passed the first aperture, and a third membrane for introducing the light that has passed the first aperture to the second aperture, the third membrane being arranged between the first and second membranes, and connecting the first and second apertures so that the first and second apertures overlap each other, wherein $k_1>k_3$ and $k_2>k_3$ are met, where $k_1$ is an extinction coefficient of the first membrane, $k_2$ is an extinction coefficient of the second membrane, and $k_3$ is an extinction coefficient of the third membrane.

A measuring apparatus according to still another aspect of the present invention for measuring optical performance of a test optics by using light includes a member that includes a first membrane having a first aperture for generating an ideal wave front from the light, and a second membrane having a second aperture for generating an ideal wave front from the light that has passed the first aperture, the second membrane being spaced from the first membrane so that the first and second apertures overlap each other, and a detector for detecting an interference fringe between the ideal wave front that passes the second aperture and the test wave front that reflects the optical performance of the test optics.

A measuring apparatus according to another aspect of the present invention for measuring optical performance of a test optics by using light includes a member that includes a first membrane having a first aperture for generating an ideal wave front from the light, a second membrane having a second aperture for generating an ideal wave front from the light that has passed the first aperture, and a third membrane for introducing the light that has passed the first aperture to the second aperture, the third membrane being arranged between the first and second membranes, and connecting the first and second apertures so that the first and second apertures overlap each other, and a detector for detecting an interference fringe between the ideal wave front that passes the second aperture and the test wave front that reflects the optical performance of the test optics, wherein $k_1>k_3$ and $k_2>k_3$ are met, where $k_1$ is an extinction coefficient of the first membrane, $k_2$ is an extinction coefficient of the second membrane, and $k_3$ is an extinction coefficient of the third membrane.

An exposure apparatus according to another aspect of the present invention for exposing a pattern of a reticle onto an object includes a projection optical system for projecting the pattern onto the object, optical performance of the projection optical system which has been measured by the above measuring apparatus having a predetermined value.

An exposure apparatus according to another aspect of the present invention for exposing a pattern of a reticle onto an object by using light from a light source includes a projection optical system for projecting the pattern onto the object, and the above measuring apparatus for measuring optical performance of the projection optical system using the light.

An exposure method according to another aspect of the present invention includes the steps of calculating optical performance of a projection optical system using the above measuring apparatus, adjusting the projection optical system based on the optical performance of the projection optical system, which is calculated by the calculating step, and exposing an object using an exposure apparatus that includes the projection optical system adjusted by the adjusting step.

A device manufacturing method according to another aspect of the present invention includes the steps of exposing an object using the above exposure apparatus, and developing the object that has been exposed.

Other objects and further features of the present invention will become readily apparent from the following description of the preferred embodiments with reference to the accompanying drawings.

BRIEF DESCRIPTION OF THE DRAWINGS

FIGS. 3A to 3C are schematic plane views of components of the measuring apparatus that utilizes an LDI.

DETAILED DESCRIPTION OF THE PREFERRED EMBODIMENTS

Figure 1:
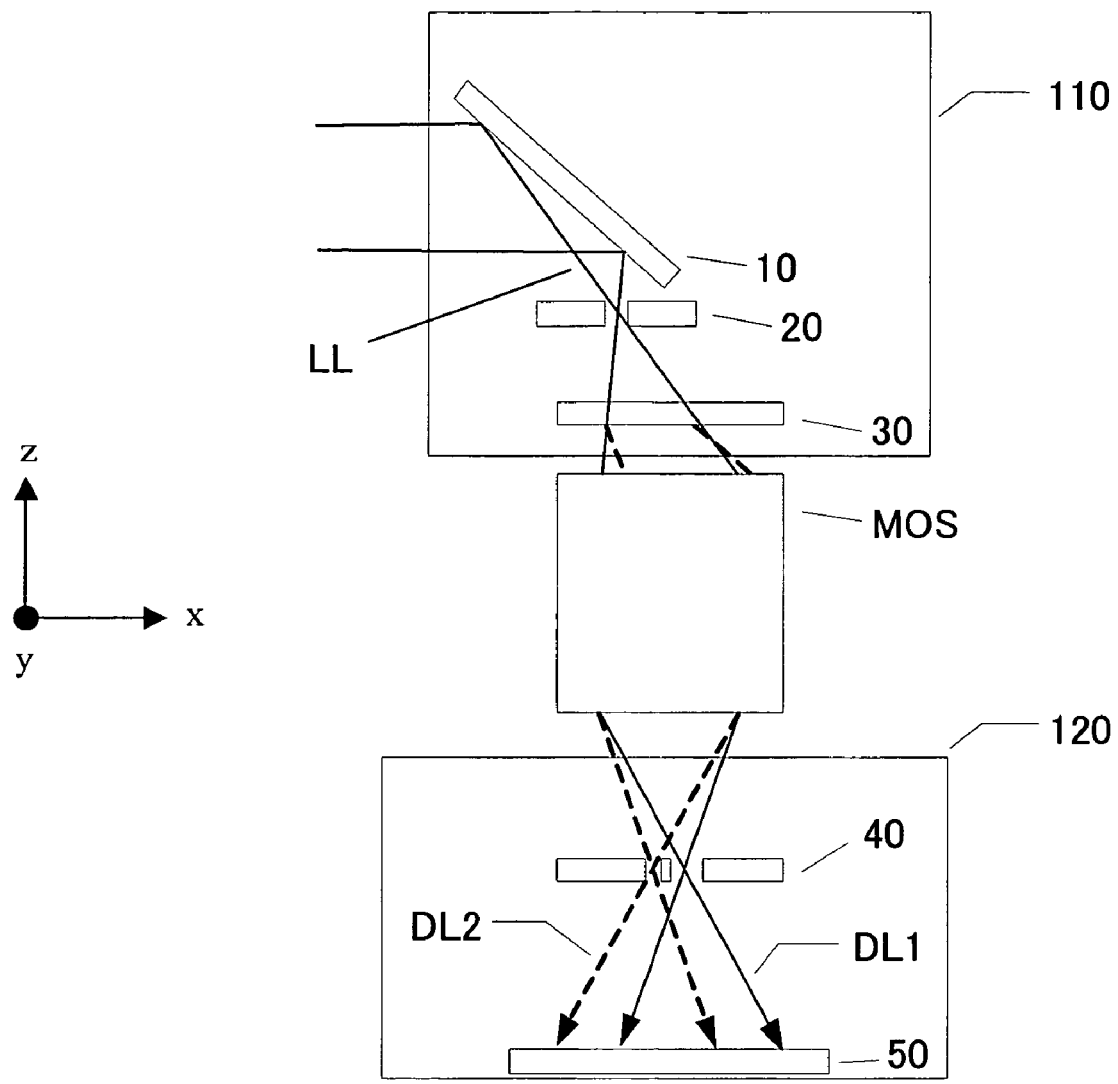
FIG. 1 is a schematic block diagram showing a structure of a measuring apparatus as one aspect according to the present invention.
Figure 2A:
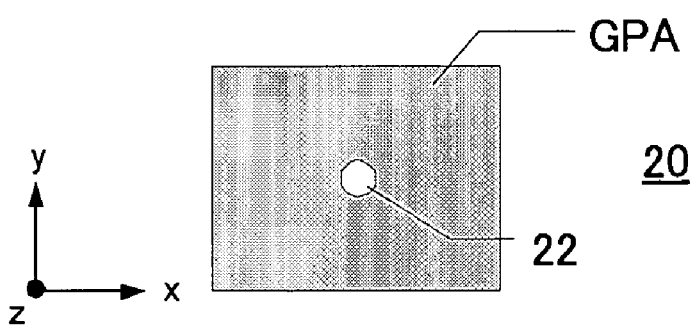
FIGS. 2A to 2C are schematic plane views of components in the measuring apparatus shown in FIG. 1.
Figure 2B:
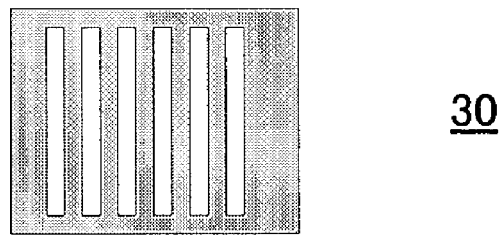
Figure 2C:
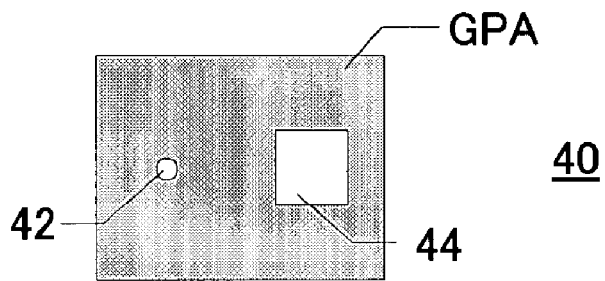

A description will now be given of a measuring apparatus 1 as one aspect of the present invention, with reference to the accompanying drawings. In each figure, the same reference numeral denotes the same element, and a duplicate description will be omitted. FIG. 1 is schematic block diagram showing a structure of the measuring apparatus 1. FIGS. 2A-2C are schematic planes view of components of the measuring apparatus 1. More specifically, FIG. 2A is a plane view of a first mask 20, FIG. 2B is a plane view of a grating 30, and FIG. 2C is a plane view of a second mask 40.

The measuring apparatus 1 measures the optical performance of a test optics MOS by detecting an interference fringe. The measuring apparatus 1 measures the wave front aberration of the test optics MOS using the PDI.

The measuring apparatus 1 includes, as shown in FIG. 1, an illumination unit 110 and a light receiving unit 120. MOS is a test optics. The illumination unit 110 includes an illumination optical system 10 that emits the illumination light LL, a first mask 20 as a first patterned member, and a grating 30 that diffracts the illumination light LL. The light source is omitted. The light receiving unit 120 includes a second mask 40 as a second patterned member, and a detector 50 that includes a light receiving element, such as a CCD. DL1 is one diffracted light from the grating 30, and transmits through a transmission window 44 in the second mask 40 after transmitting the test optics MOS. DL2 is one diffracted light from the grating 30, and has a diffraction order different from the diffracted light DL1. The diffracted light DL2 is irradiated onto the second pinhole 42 in the second mask 40, and generated from a second pinhole 42 in the second mask 40.

The illumination optical system 10 includes an optical element, and is likely to have a wave front aberration larger than that of the test optics MOS in this embodiment. Accordingly, as shown in FIG. 2, the illumination light LL is irradiated onto a first pinhole 22 in the first mask 20, and generates an ideal spherical wave that has a reduced aberration by using the first pinhole 22. Plural orders of diffracted lights are generated as a result of the spherical wave transmitting through the grating 30.

The diffracted lights generated from the grating transmit through or are reflected by the test optics MOS. One diffracted light transmits through the transmission window 44 in the second mask 40, and another diffracted light enters the second pinhole 42 in the second mask 44.

The light DL1 that transmits through the transmission window 44 in the second mask 40 has a wave front aberration caused by the surface precision error and the adjustment error of the test optics MOS. On the other hand, the light DL2 generated from the pinhole 42 in the second mask 40 has a wave front close to the ideal spherical wave after diffracted by the second pinhole 42. The detector 50 detects an interference fringe (intensity pattern) formed by the interference between the light DL2 as the reference light and the light DL1 having the test wave front. The surface precision error of the test optics MOS is calculated through an analysis of the detected interference fringe.

Here, the first mask 20 and the second mask 40 are used to reduce the wave front aberration of the illumination optical system 10 and the test optics MOS, and generate a wave front close to the ideal spherical wave. In other words, the first mask 20 and the second mask 40 serve to generate a reference wave front.

The measuring apparatus 1 when using the LDI applies first masks 20A and 20B shown in FIG. 3A having first slits 22a and 22b instead of the first mask 20, and gratings 30A and 30B shown in FIG. 3B instead of the grating 30, and second masks 40A and 40B shown in FIG. 3C having second slits 42a, 42b and transmission windows 44a, 44b. Here, FIGS. 3A to 3C are schematic plane view of components in the measuring apparatus 1 that utilizes the LDI. More specifically, FIG. 3A is a plane view of the first mask 20A, FIG. 3B is a plane view of a grating 30A, and FIG. 3C is a plane view of the second masks 40A and 40B.

In order to make the reference wave front generated from the first pinhole 22 and/or the second pinhole 42 close to the ideal spherical wave, the first mask 20 and the second mask 40 need to shield the light in an area GPA outside the pinhole, and thus the first pinhole 22 and the second pinhole 42 (or the first mask 20 and the second mask 40) should have the finite thickness. In the LDI, the area GPA outside the slit needs to shield the light similarly. Therefore, the first slits 22a and 22b, and the second slits 42a and 42b (or the first masks 20A and 20B, and the second masks 40A and 40B) should have the finite thicknesses.

Figure 4:
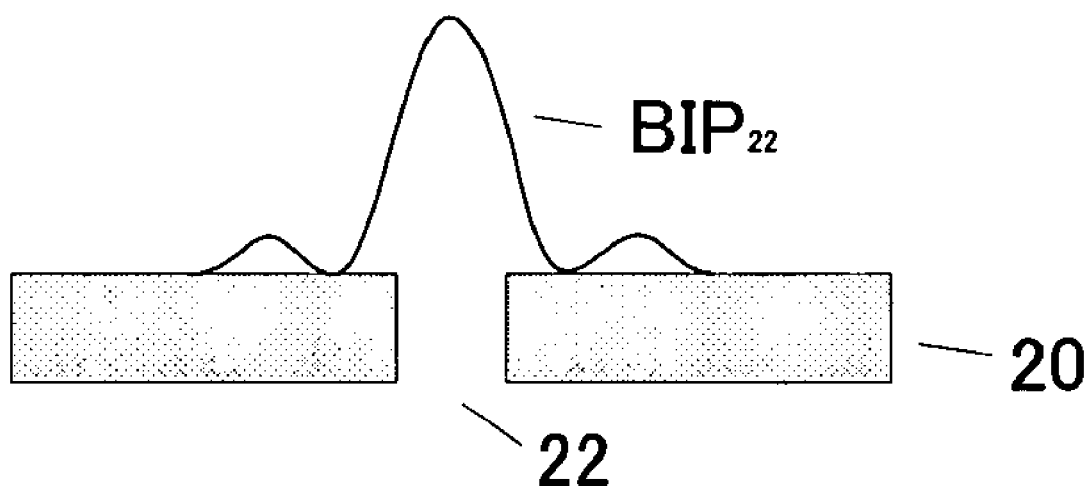
FIG. 4 is a schematic sectional view of a first mask shown in FIG. 1.
Figure 5:
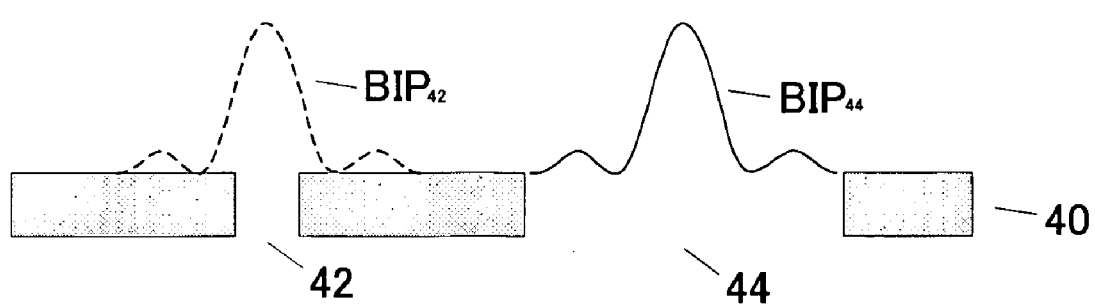
FIG. 5 is a schematic sectional view of a second mask shown in FIG. 1.

FIG. 4 is a schematic sectional view of the first mask 20, and $BIP_{22}$ is a beam intensity profile irradiated onto the first pinhole 22 in the first mask 20. FIG. 5 is a schematic sectional view of the second mask 40, and $BIP_{42}$ and $BIP_{44}$ are beam intensity profiles irradiated onto the second pinhole 42 and the transmission window 44 in the second mask 40. The beam intensity profiles of the first masks 20A and 20B, and the second masks 40A and 40B are the same as those shown in FIGS. 4 and 5 in the measuring apparatus that utilizes the LDI. The following description refers to a pinhole and slit as an aperture and ideal spherical and cylindrical waves as an ideal wave front.

The first mask 20 and/or the second mask 40 that have apertures and possess a finite thickness cause a wave front shape generated from the aperture to include an error (or reference wave front deviation) from the ideal spherical or cylindrical wave. The reference wave front deviation increases when the aperture center shifts from the optical axis of the irradiated light, and when the irradiated light includes the wave front aberration. The instant inventor has discovered that the increase of the reference wave front deviation is restrained when the first mask 20 and the second mask 40 are made of two-layer membranes, for example, and by according the aperture centers of each of two-layer membranes.

Figure 6:
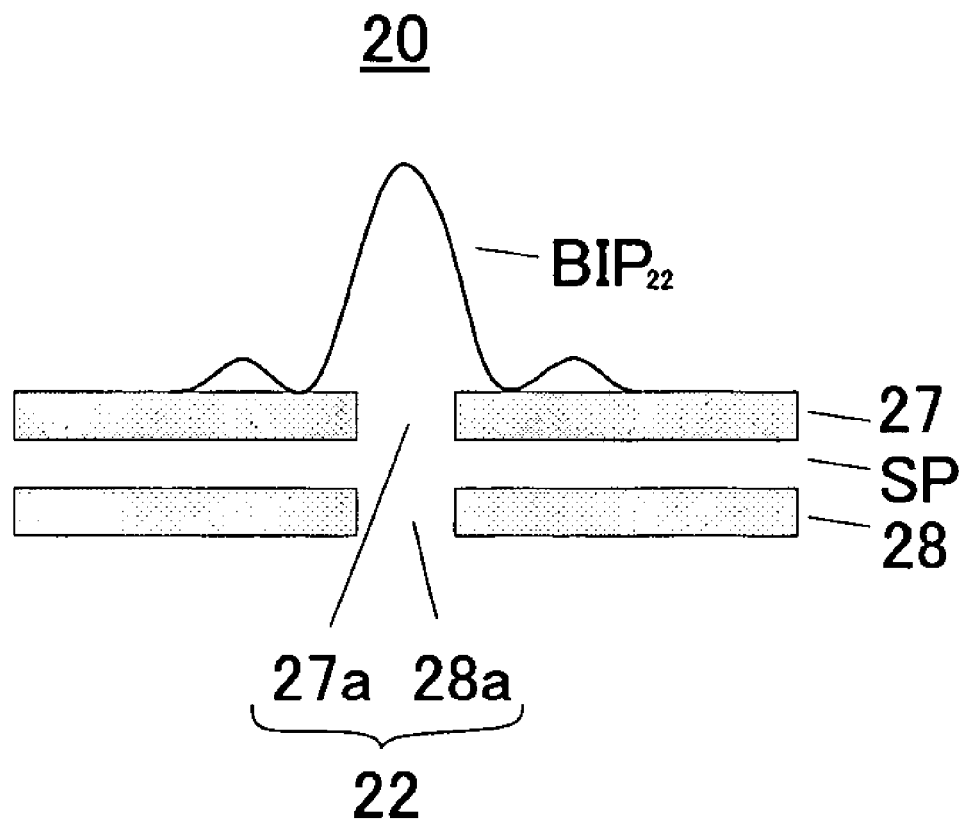
FIG. 6 is a detailed sectional view of a first mask shown in FIG. 4.

FIG. 6 shows the first mask 20 made of two-layer membranes in order to restrain the increase of the reference wave front deviation. Similar to FIG. 4, $BIP_{22}$ is a beam intensity profile irradiated onto the first pinhole 22, which transmits through or is reflected by the illumination optical system 10.

Referring to FIG. 6, the first mask 20 includes a first membrane 27 having a first aperture 27a that diffracts the illuminated light LL, and a second membrane 28 having a second aperture 28a that diffracts the light from the first aperture 27a. The first membrane 27 and the second membrane 28 are arranged so that the center of the first aperture 27a accords with the center of the second aperture 28a via a space SP that is less likely to absorb the illuminated light LL.

The illuminated light LL irradiated onto the first membrane 27 is diffracted by the first aperture 27a in the first membrane 27, and generates the light that reduces a wave front aberration caused by the illumination optical system 10 and the optical axis offset. The diffracted light is irradiated onto the second membrane 28 after propagating the space SP.

The light irradiated onto the second membrane 28 is diffracted by the second aperture 28a in the second membrane 28, and generates the light that further reduces a wave front aberration caused by the illumination optical system 10 and the optical axis offset. Therefore, the first mask 20 reduce the reference wave front aberration, and forms a reference wave front closer to the ideal wave front than the conventional pinhole mask, improving the measuring precision of the measuring apparatus 1. While the first mask 20 is made of the two-layer membranes, it may be made of three or more layers of membranes. While this embodiment arranges the first membrane 27 and the second membrane 28 so that the center of the first aperture 27a accords with the center of the second aperture 28a, the similar effect is obtained by arranging the first membrane 27 and the second membrane 28 so that the first aperture 27a overlaps the second aperture 28a.

Figure 7:
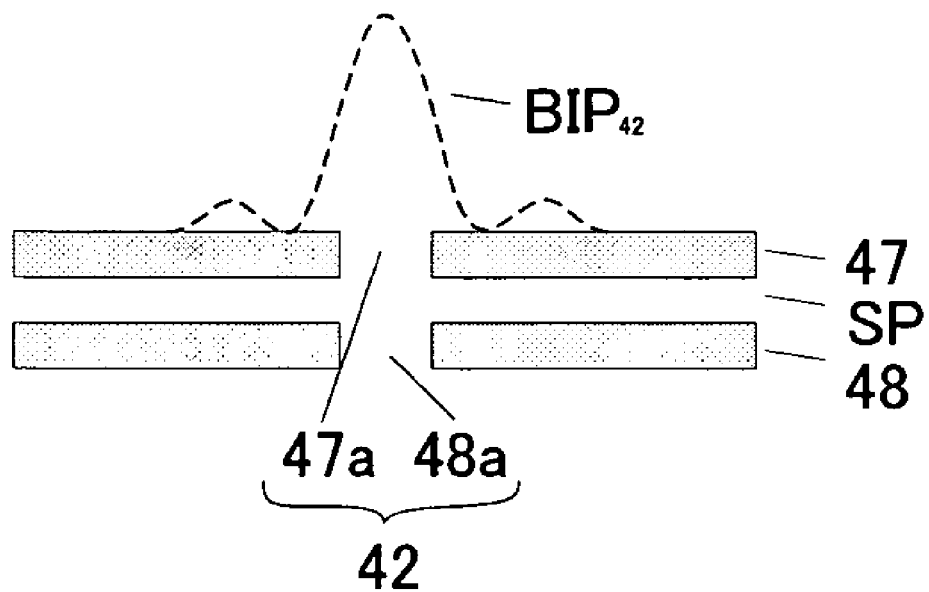
FIG. 7 is a detailed sectional view of a second mask shown in FIG. 5.

FIG. 7 shows a second mask 40 that is made of two-layer membranes, similar to the first mask 20, so as to restrain the increase of the reference wave front deviation. Similar to FIG. 5, $BIP_{42}$ is a beam intensity profile irradiated onto the second pinhole 42 in the second mask 40, which has transmitted or been reflected by the test optics MOS.

Referring to FIG. 7, the second mask 40 includes a first membrane 47 having a first aperture 47a that diffracts the light from the test optics MOS, and a second aperture 48 having a second aperture 48a that diffracts the light from the first aperture 47a. The first membrane 47 and the second membrane 48 are arranged so that the center of the first aperture 47a accords with the center of the second aperture 48a via a space SP that is less likely to absorb the light. The second mask 40 can reduce the reference wave front deviation of the light generated from the second pinhole 42. Since the reference wave front becomes closer to the ideal wave front, the measuring apparatus 1 can improve the measuring precision. While the first mask 20 is made of the two-layer membranes, it may be made of three or more layers of membranes. While this embodiment arranges the first membrane 47 and the second membrane 48 so that the center of the first aperture 47a accords with the center of the second aperture 48a, the similar effect is obtained by arranging the first membrane 47 and the second membrane 48 so that the first aperture 47a overlaps the second aperture 48a.

Figure 8:
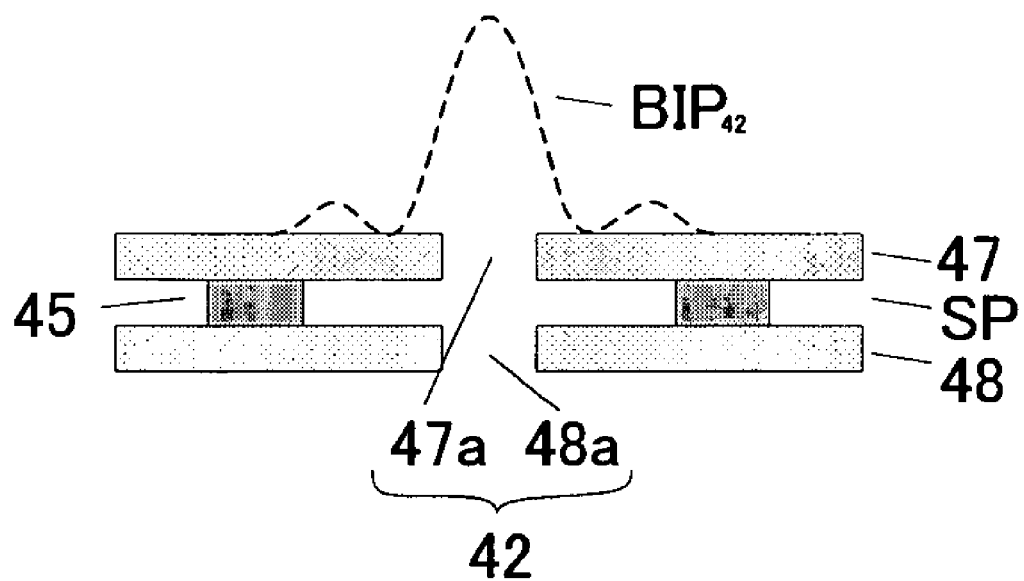
FIG. 8 is a schematic sectional view of a section mask having a spacer.

The second mask 40 may arrange a spacer 45 in the space SP as shown in FIG. 8. The spacer 45 is connected to the first membrane 47 and the second membrane 48, and maintains the space SP at a certain distance between the first membrane 47 and the second membrane 48. The spacer 45 reduces thermal and gravity deformations of the first membrane 47 and the second membrane 48, and precisely accords the center of the first aperture 47a with the center of the second aperture 48a. Of course, this spacer is applicable to the first mask 20. Here, FIG. 8 is a schematic sectional view of the second mask 40 having the spacer 45.

Figure 9:
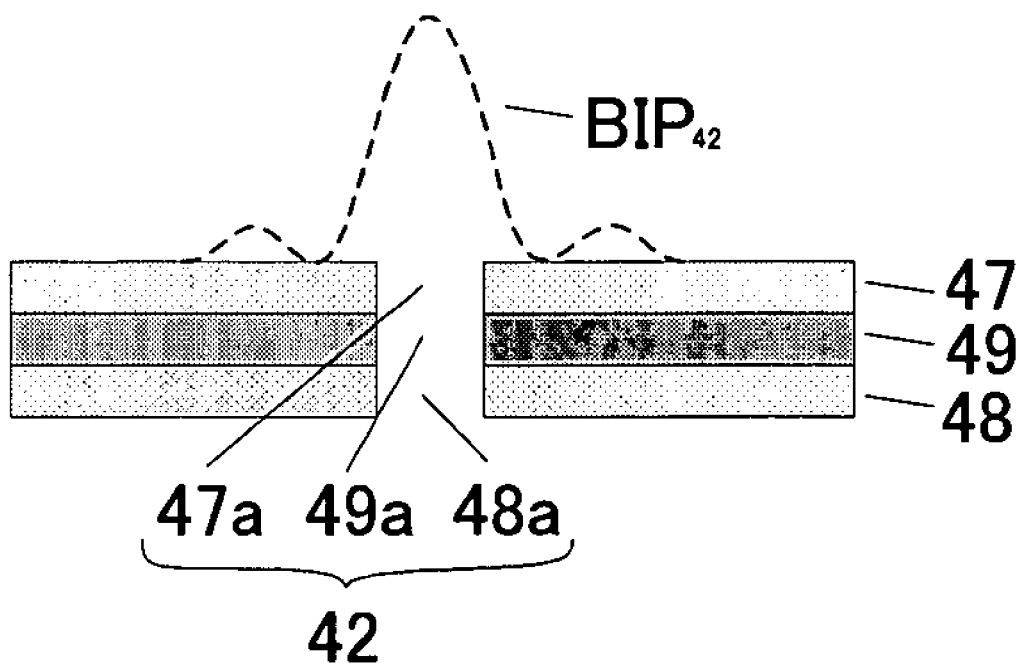
FIG. 9 is a schematic sectional view of a second mask having a third membrane between first and second membranes.

FIG. 9 is a schematic sectional view of the second mask 40 having a third membrane 49 in the space SP between the first membrane 47 and the second membrane 48. The third membrane 49 has a third aperture 49a that introduces the light from the first aperture 47a to the second aperture 48a, and connects the first membrane 47 to the second membrane 48 so that the center of the first aperture 47a accords with the center of the second aperture 48a. When the third membrane 49 is unlikely to absorb the light, the third aperture 49a may be omitted. As discussed above, the third membrane 49 may connect the first membrane 47 to the second membrane 48 so that the first aperture 47a overlaps the second aperture 48a. The second mask 40 shown in FIG. 9 is applicable to the first mask 20.

The first aperture 47a generates the spreading diffracted light when $k_1$ is set greater than $k_3$ in the second mask 40, where $k_1$ is an extinction coefficient of the first membrane 47, $k_2$ is an extinction coefficient of the second membrane 48, and $k_3$ is an extinction coefficient of the third membrane 49. In addition, when $k_2$ is set greater than $k_3$, the second aperture 48a generates the light that is less affected by the wave front aberration of the irradiated light and the positional offset between the optical axis of the irradiated light and the center of the second aperture 48a. The extinction coefficient is an imaginary part of complex index of refraction.

As shown in FIG. 9, the third membrane 49 improves the rigidity of the second mask 40, and reduces the influence of the deformation. The second mask 40 for the visual light can be easily produced when the third membrane 49 is made of an approximately transparent quartz substrate, a membrane has a large extinction coefficient, such as chrome, on front and rear surfaces of the substrate, and an aperture is formed by using the photolithography, etching, electron beam, and ion beam.

When the measuring apparatus 1 measures the optical performance of the test optics MOS by using the LDI, a circular shape of the first pinhole 22 in the first mask 20 and the second pinhole 42 in the second mask 42 is replaced with a slit shape. The slit width (in the short direction of the slit) generates the diffracted light that reduces the wave front aberration of the irradiated light when it is shorter than the width of the beam intensity profile of the irradiated light. When the light from the rectangular aperture, such as a slit is condensed, the spot width is λ/NA, where λ is a wavelength of the illuminated light LL and NA is a numerical aperture of the condenser optical system (or the test optics MOS). Thus, when the slit width is smaller than λ/NA, the diffracted light reduces the wave front aberration of the irradiated light.

A description will now be given of a measuring apparatus that utilizes an LDI to measure the optical performance of the projection optical system having the NA of 0.20 in an EUV exposure apparatus (with the wavelength of 13.5 nm). The reference wave front deviation of the wave front generated from the inventive second mask 40 and the conventional mask are calculated using the strict electromagnetic-field numerical calculation. The conventional mask is made of Ni and has the thickness of 150 nm, whereas the inventive second mask 40 includes the first membrane 47 that is made of Ni and has the thickness of 50 nm, the second membrane 48 that is made of Ni and has the thickness of 150 nm, and the third membrane 49 that is made of SiN and has the thickness of 150 nm. Both the inventive second mask 40 and the conventional mask have the slit width of 50 nm.

Figure 10:
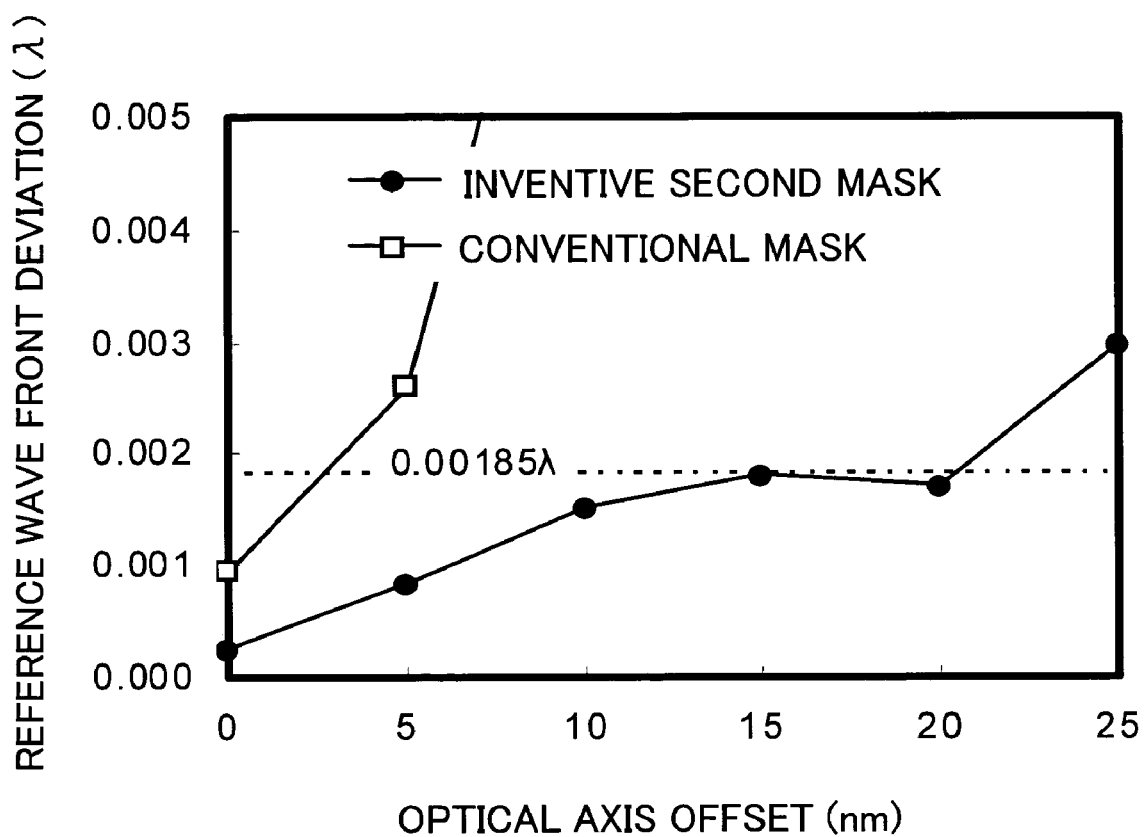
FIG. 10 is a graph showing a relationship between an optical axis offset and a reference wave front deviation in the second mask shown in FIG. 9 and a conventional mask.

FIG. 10 is a graph of the error from the ideal cylindrical wave of the wave front generated from the slit or the reference wave front deviation from the inventive second membrane 40 (Ni 50 nm/SiN 150 nm/Ni 150 nm) and the conventional mask (Ni 150 nm) when the optical axis offset or positional offset occurs between the optical axis of the irradiated light and the center of the slit. In FIG. 10, the abscissa axis is the optical axis offset, and the ordinate axis is the reference wave front deviation.

Referring to FIG. 10, the reference wave front deviation increases greatly in the conventional mask as the optical axis offset increases, because the wave front deviation of the wave front generated from the slit is 2.5 m$\lambda$ or greater for the optical axis offset of 5 nm and 5 m$\lambda$ or greater for the optical axis offset of 10 nm. On the other hand, it is understood that the inventive second mask 40 maintains the reference wave front deviation of 2 m$\lambda$ or smaller even when the optical axis offset of 20 nm occurs.

The measuring precision for the projection optical system in the EUV exposure apparatus is required to have about 0.1 nm RMS, which corresponds to 0.1 nm/13.5 nm=7.4 m$\lambda$ RMS when converted into the wavelength unit. The measuring error in the interferometer roughly includes a system error, a reference wave front deviation generated from the first mask, a reference wave front deviation generated from the second mask, and the interference fringe analysis error. Among them, the reference wave front deviation in the second mask has a permissible range of 7.4 m$\lambda$/4=1.85 m$\lambda$.

Referring to FIG. 10, the optical axis offset that provides the reference wave front deviation of 1.85 $\lambda$RMS or smaller is 2.5 nm or smaller in the conventional mask, and it is difficult to control positions of the optical axis and the mask with that precision. On the other hand, the inventive second mask 40 allows the optical axis offset of about 20 nm, improving the measuring precision of the LDI. Therefore, use of the measuring apparatus is facilitated since no highly precise positioning is necessary.

The measuring apparatus 1 that utilizes the PDI generates the light having a wave front close to the ideal spherical wave when an approximately circular shape is used for the first and second pinholes 22 and 42 in the first and second masks 20 and 40. When the light from the circular aperture, such as a pinhole, is condensed, the spot diameter becomes 1.22×$\lambda$/NA. Thus, when the pinhole diameter is 1.22×$\lambda$/NA or smaller, the light reduces the wave front aberration of the irradiated light.

Similar to the measuring apparatus that utilizes the LDI, the reference wave front deviation of the wave front from the inventive second mask 40 and the conventional mask is calculated by using the strict electromagnetic-field numerical calculation. The conventional mask is made of Ni and has the thickness of 150 nm, whereas the inventive second mask 40 includes the first membrane 47 that is made of Ni and has the thickness of 50 nm, the second membrane 48 that is made of Ni and has the thickness of 150 nm, and the third membrane 49 that is made of SiN and has the thickness of 150 nm. Both the inventive second mask 40 and the conventional mask have the pinhole diameter of 50 nm.

Figure 11:
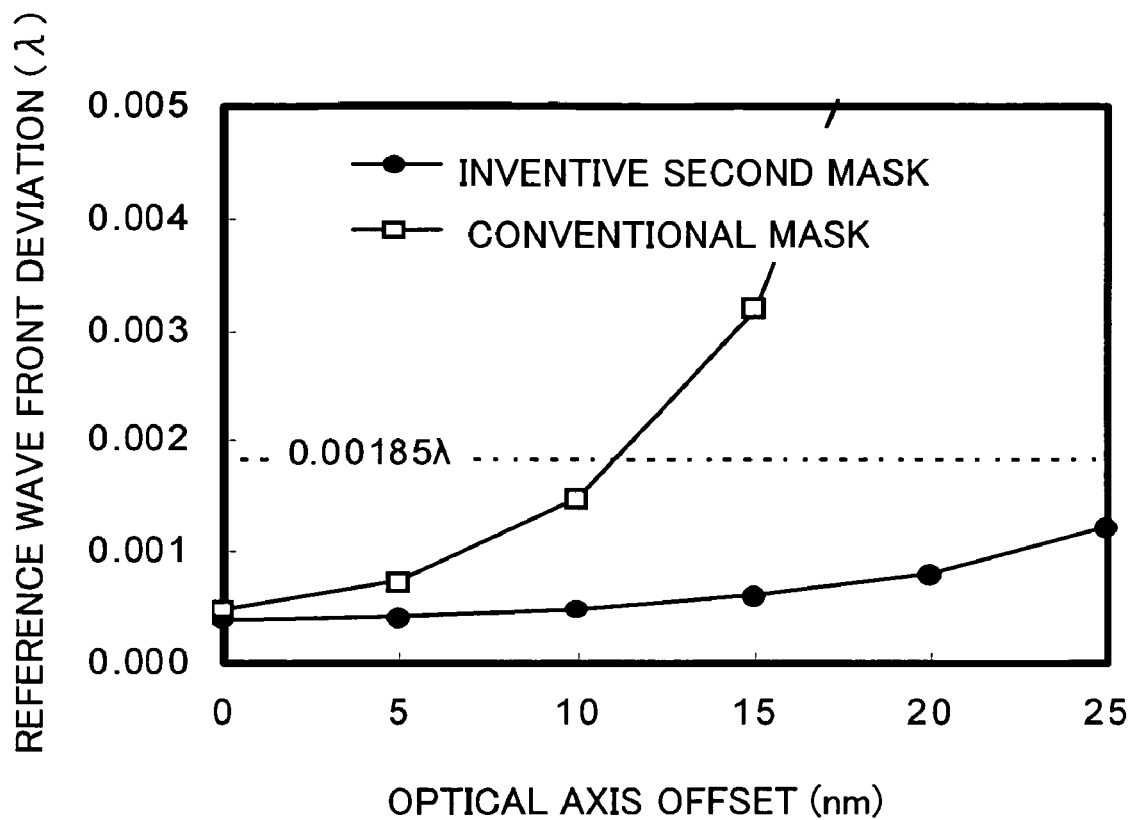
FIG. 11 is a graph showing a relationship between an optical axis offset and a reference wave front deviation in the second mask shown in FIG. 9 and a conventional mask.

FIG. 11 is a graph of the error from the ideal spherical wave of the wave front generated from the pinhole or the reference wave front deviation generated from the inventive second membrane 40 (Ni 50 nm/SiN 150 nm/Ni 150 nm) and the conventional mask (Ni 150 nm) when the optical axis offset or positional offset occurs between the optical axis of the irradiated light and the center of the slit. In FIG. 11, the abscissa axis is the optical axis offset, and the ordinate axis is the reference wave front deviation.

Referring to FIG. 11, the optical axis offset that provides the reference wave front deviation of 1.85 $\lambda$RMS or smaller is 11 nm or smaller in the conventional mask, but the inventive second mask 40 enlarges the optical axis offset up to about 25 nm or greater, improving the measuring precision of the PDI. Use of the measuring apparatus is facilitated, since no highly precise positioning is necessary.

The illumination optical system 10 and the test optics MOS are not stigmatic but have a predetermined aberration. The reference wave front deviation should be maintained small even for the aberrational incident light.

Figure 12:
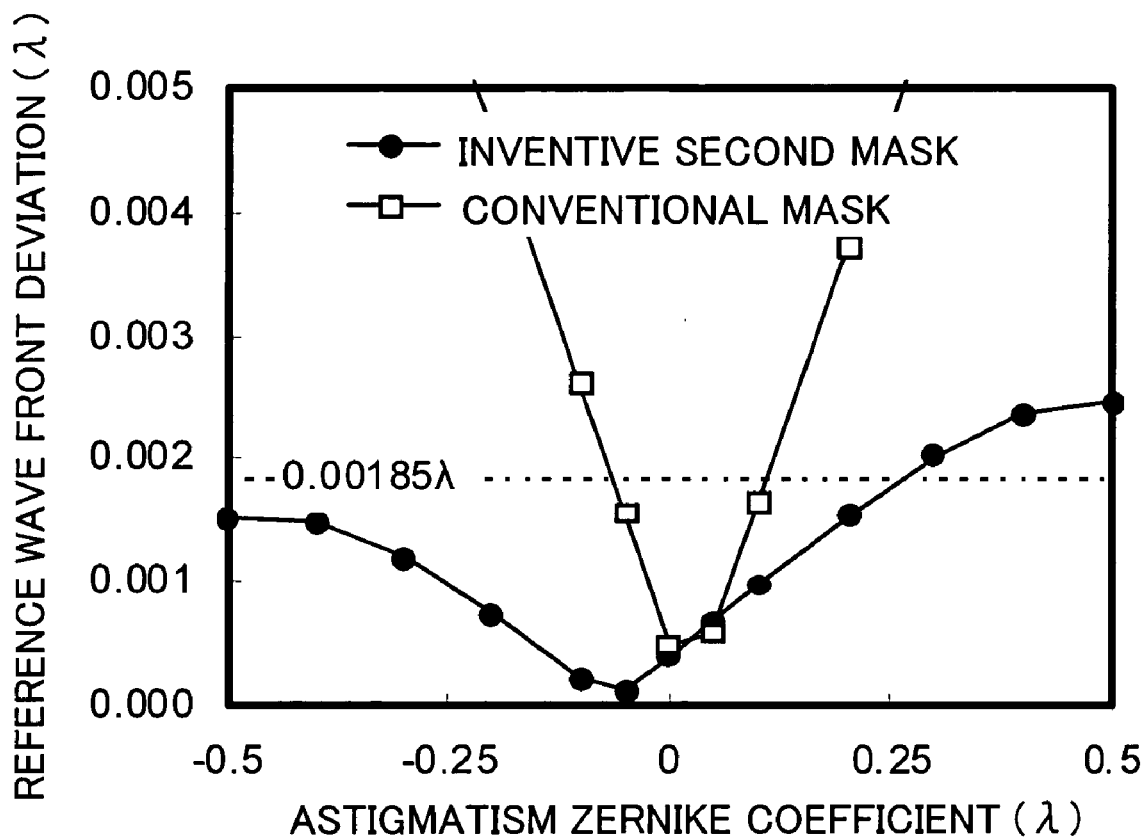
FIG. 12 is a graph showing a relationship between the astigmatism of the irradiated light and a reference wave front deviation in the second mask shown in FIG. 9 and a conventional mask.

FIG. 12 is a graph of the error from the ideal spherical wave of the wave front generated from the pinhole or the reference wave front deviation generated from the inventive second membrane 40 (Ni 50 nm/SiN 150 nm/Ni 150 nm) and the conventional mask (Ni 150 nm) when the irradiated light has astigmatism. In FIG. 12, the abscissa axis is a low order astigmatism coefficient in the Fringe Zernike polynomial, and the ordinate axis is the reference wave front deviation.

Referring to FIG. 12, the reference wave front deviation is 1.85 $\lambda$RMS in the conventional mask when the astigmatism coefficient is in a range between −0.05 $\lambda$ and 0.1$\lambda$, whereas the reference wave front deviation is 1.85 $\lambda$RMS in the inventive second mask 40 when the astigmatism coefficient is in a broader range between −0.5$\lambda$ and 0.25 $\lambda$, improving the measuring precision of the PDI. Use of the measuring apparatus is facilitated, since no highly precise positioning is necessary. When the irradiated light is a linearly polarized light, the aperture shape (or the circular shape) of the second mask 40 can further reduce the reference wave front deviation by converting the light into the elliptical shape according to the polarization direction.

The diffracted light from the first aperture 47a in the first membrane 47 that receives the irradiated light first is similar to the Fresnel diffraction in the region close to the first aperture 47a, and then becomes similar to the Fraunhofer diffraction as a result of a further propagation. Equation 1 below provides a region that generates the diffracted light similar to the Fresnel diffraction, where d is a propagation distance in the perpendicular direction from the exit of the first aperture 47a, $\lambda$ is the wavelength of the light, n is the refractive index of the propagating material, and a is the maximum width of the first aperture 47a:

$$d < n \times a^2/(4\lambda) \qquad \text{[EQUATION 1]}$$

The spread of the diffracted light is greater than the maximum width a of the first aperture 47a in the area expressed by Equation 2 below:

$$d > n \times a^2/(4\lambda) \qquad \text{[EQUATION 2]}$$

The reference wave front deviation from the second aperture 48a reduces when the spread of the diffracted light is greater than the maximum width of the second aperture 48a before the light reaches the second aperture 48a in the second membrane 48.

Figure 13:
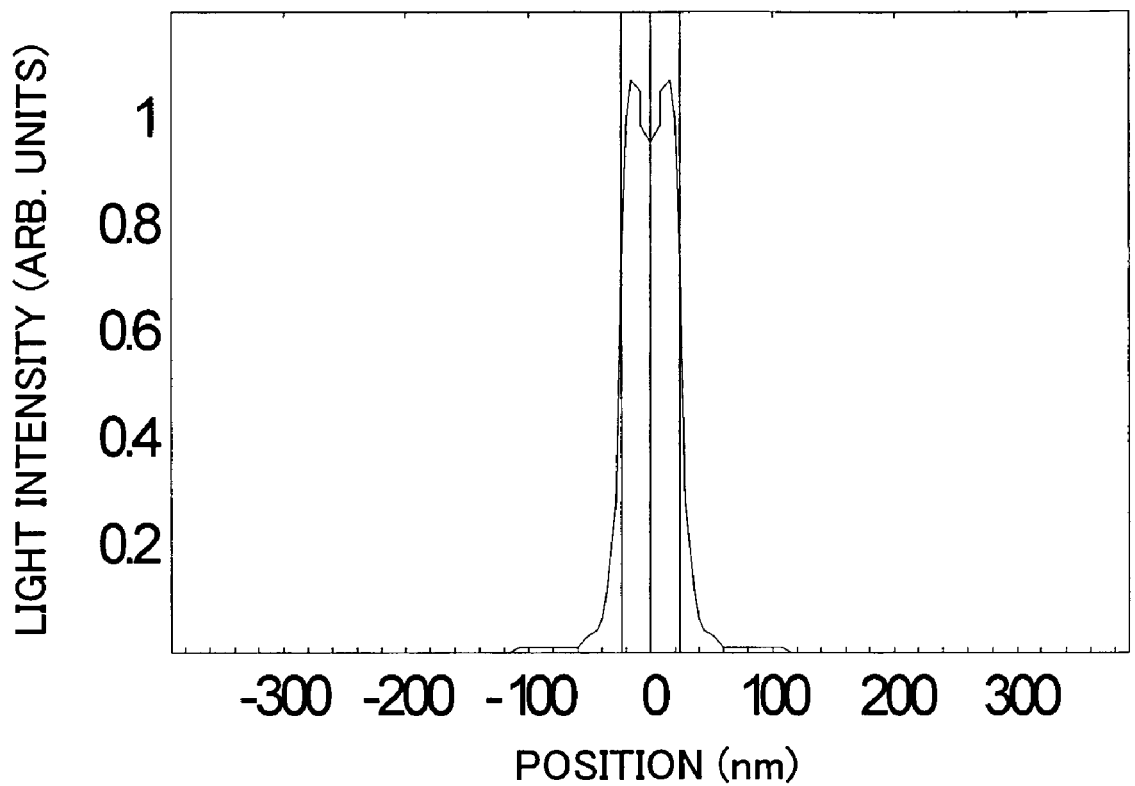
FIG. 13 is a graph of the light intensity distribution in a direction parallel to the aperture surface when Equation 1 is met and the light propagates by 2 nm from a first aperture.

For example, the light intensity distribution of the diffracted light from the first aperture 47a having the aperture width of 50 nm is calculated on the assumption that the wavelength is 13.5 nm and the first membrane 47 is an infinitely thin and perfect light shielding member. FIG. 13 is a graph of the light intensity distribution in the direction parallel to the aperture surface when the light propagates by 2 nm from the first aperture 47a. In FIG. 13, the abscissa axis is the position of the first aperture 47a, and the ordinate axis is the light intensity. Referring to FIG. 13, it is understood that the light intensity distribution within the aperture width 50 nm does not have a peaked intensity along the center axis and the light intensity abruptly decreases outside the aperture width 50 nm.

Figure 14:
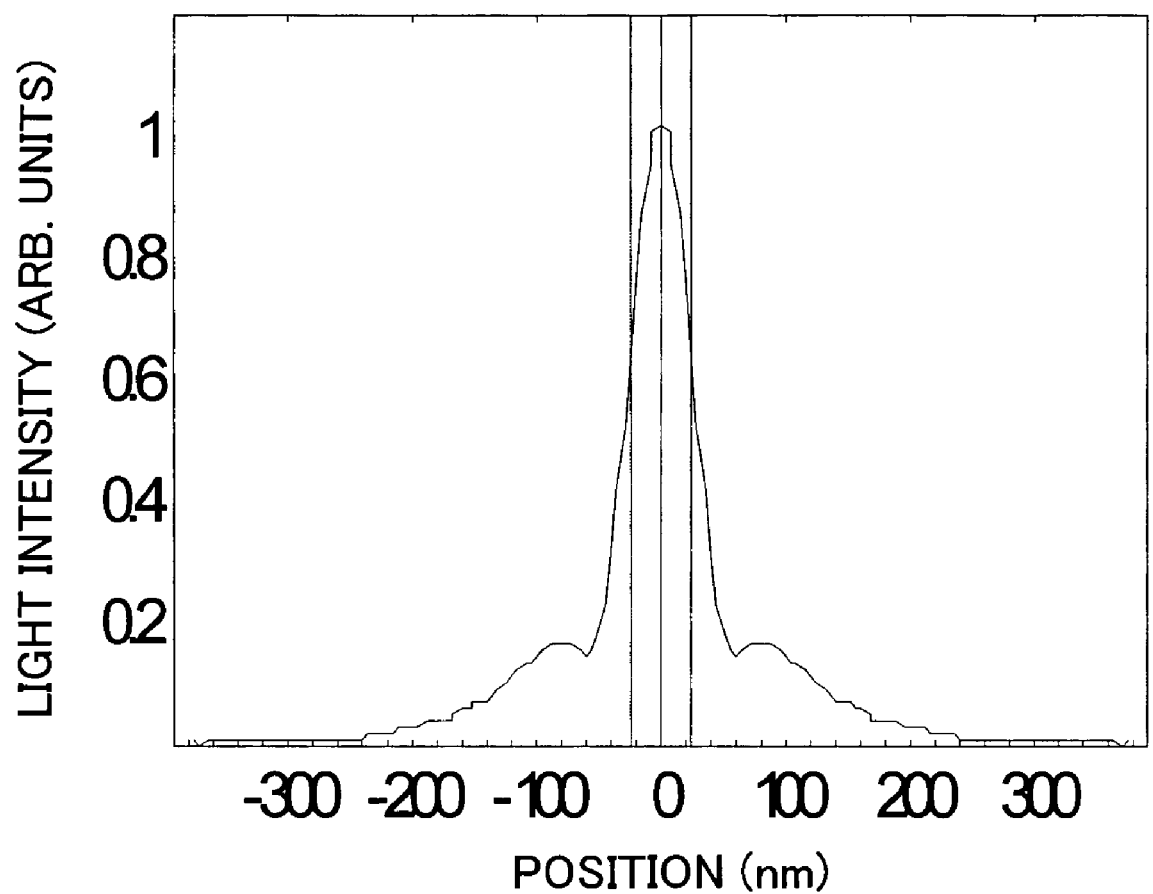
FIG. 14 is a graph of the light intensity distribution in a direction parallel to the aperture surface when Equation 2 is met and the light propagates by 47 nm from a first aperture.

FIG. 14 is a graph showing the light intensity distribution in the direction parallel to the aperture surface when the light propagates by 47 nm from the first aperture 47a while the condition of Equation 2 is met. In FIG. 14, the abscissa axis is a position of the first aperture 47a, and the ordinate axis is the light intensity. Referring to FIG. 14, it is understood that the light spreads over the area outside the aperture width of 50 nm.

Figure 15:
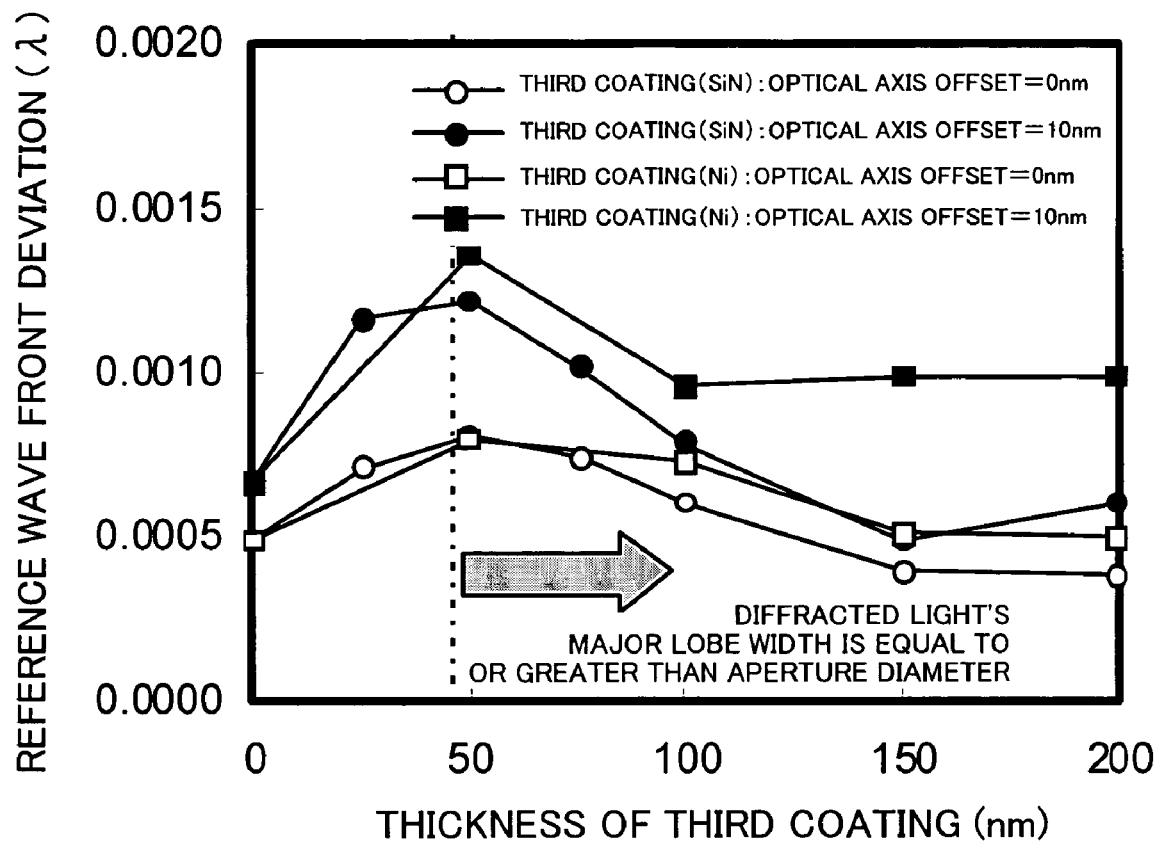
FIG. 15 is a graph showing a relationship between the thickness of the third membrane and the reference wave front deviation generated from the second mask.

Suppose that the first membrane 47 has the finite thickness and absorbs the light. A description will be given of the reference wave front aberration of the second mask 40 that illustratively includes the first membrane 47 that is made of Ni and has the thickness of 50 nm, and the second membrane 48 that is made of Ni and has the thickness of 150 nm. FIG. 15 is a graph showing the reference wave front deviation generated from the second mask 40 when the thickness of the third membrane 49 changes. In FIG. 15, the abscissa axis is the thickness of the third membrane 49 and the ordinate axis is the reference wave front deviation.

Referring to FIG. 15, the reference wave front deviation with no optical axis offset is compared with that with an optical axis offset of 10 nm. When d>n×a²/(4λ) or d>45.6 nm where d is the thickness of the third membrane 49, the reference wave front deviation of the second mask that uses SiN having a small light absorption for the third membrane 49 is smaller than that of the second mask that uses Ni having a large light absorption for the third membrane 49. Therefore, the reference wave front deviation from the second mask 40 reduces when the thickness of the third membrane 49 in the second mask 40 is made equal to or greater than n×a²/(4λ). The similar effect is available even when the first aperture 47a in the first membrane 47 has a different shape from the second aperture 48a in the second membrane 48.

The first membrane 47 that receives the irradiated light first not only diffracts the light but also shields the light. When the optical axis offset occurs in the first membrane 47, the optical axis of the incident light or the position having the maximum incident light intensity should move to an area other than the first aperture 47a. In order for the first aperture 47a to generate the diffracted light, the attenuating thickness z' should be equal to or smaller than the light intensity at the spot diameter edge of 1/e² where e is a natural logarithm.

When the plane wave having a field intensity $I_0$ enters the first membrane 47, the field intensity I of the plane wave that transmits the dielectric by a distance z is expressed by Equation 3 below:

$$I = I_0 \exp(-\alpha z) \qquad \text{[EQUATION 3]}$$

Here, α is an absorption coefficient and is defined by Equation 4 below where k is an extinction coefficient, and λ is a wavelength:

$$\alpha = 4\pi k/\lambda \qquad \text{[EQUATION 4]}$$

The distance z' that attenuates the incident light peak intensity down to 1/e² is defined by the following Equation 5:

$$z' = \lambda/(2\pi k) \qquad \text{[EQUATION 5]}$$

The extinction coefficient k=0.0727, where the wavelength λ is 13.5 nm and the Ni is used as a material.

Figure 16:
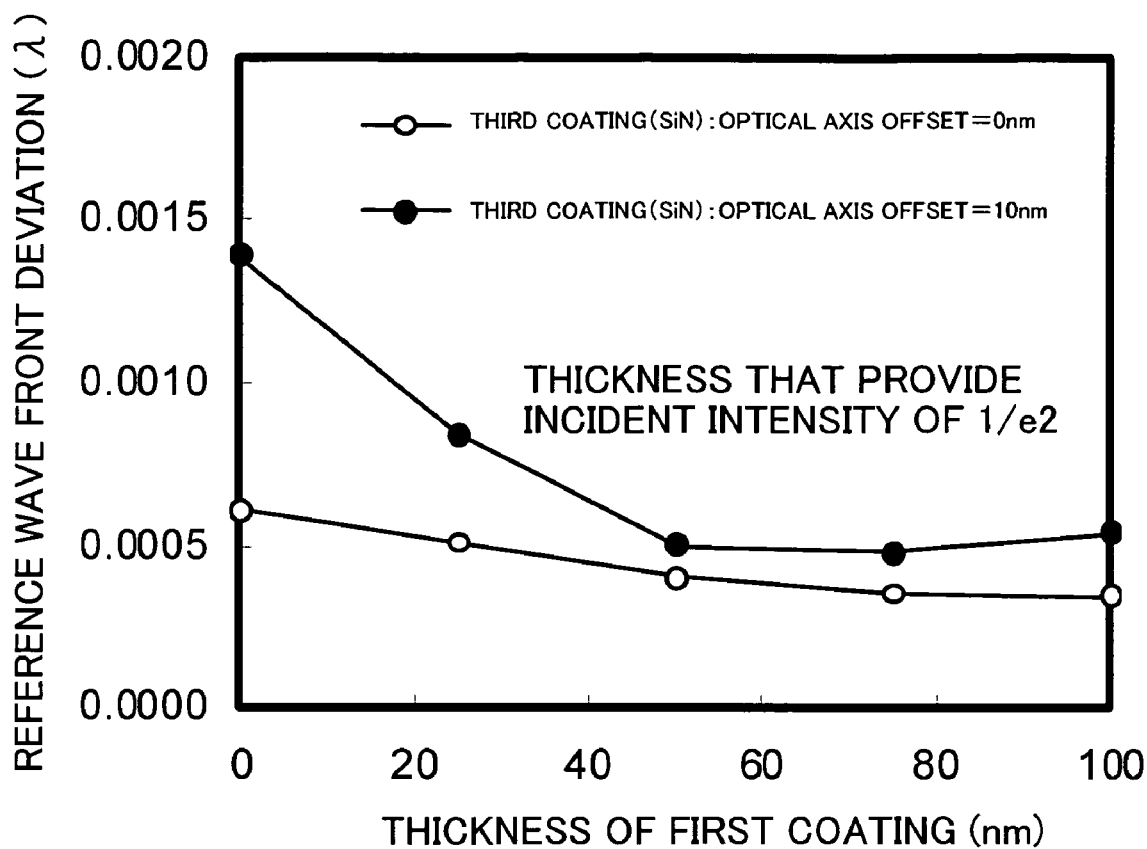
FIG. 16 is a graph showing a relationship between the thickness of the first membrane and the reference wave front deviation generated from the second mask.

FIG. 16 is a graph of the reference wave front deviation generated when the thickness changes while the aperture is a pinhole having a diameter of 50 nm, the third membrane 49 is made of SiN and has the thickness of 150 nm, the second membrane 48 is made of Ni and has the thickness of 150 nm, and the incident light has the wavelength of 13.5 nm, the second aperture 48 having a diameter of 50 nm in the inventive second mask 40 (Ni 50 nm/SiN 150 nm/Ni 150 nm). In FIG. 16, the abscissa axis is the thickness of the first membrane 47, and the ordinate axis is the reference wave front deviation.

Referring to FIG. 16, it is understood that when the thickness of the first membrane 47 is λ/(2πk) or greater, or 30 nm, the increase of the reference wave front deviation is restrained even when the optical axis shifts by 10 nm. Therefore, the thickness of the first membrane 47 of λ/(2πk) or greater would reduce the reference wave front deviation and improve the measuring precision of the measuring apparatus 1.

The second membrane 48 that finally generates the reference wave front needs to have higher light shielding performance than the first membrane 47. In this case, when the incident light intensity that is attenuated down to about 0.1% reduces the interference between the light generated from the second aperture 48a and the light that transmits through part other than the second aperture 48a. When the thickness $z_2'$ of the second membrane 48 greater than a value defined in Equation 6 would reduce the incident light intensity down to 0.1%.

$$z_2' = 1.727\lambda/(\pi k) \qquad \text{[EQUATION 6]}$$

Figure 17:
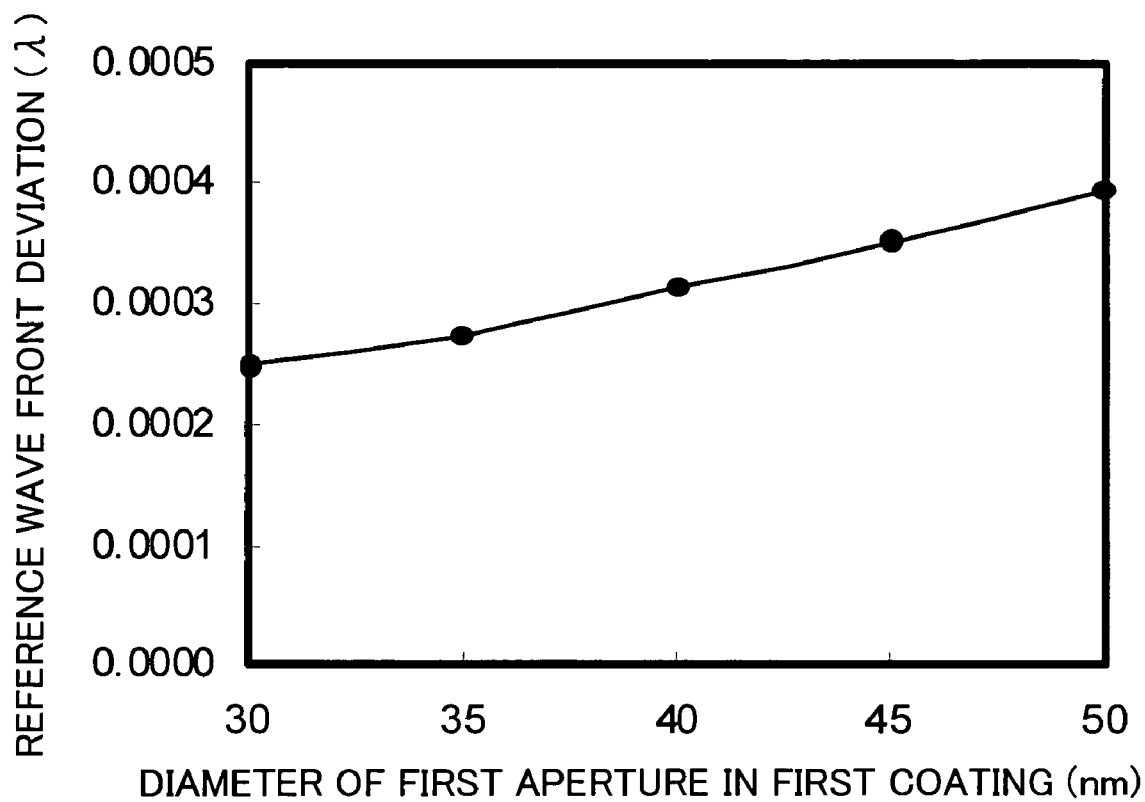
FIG. 17 is a graph showing a relationship between the frist aperture in the first membrane and a reference wave front deviation in the inventive second mask.

FIG. 17 is a graph of the reference wave front deviation generated when the first aperture 47a in the first membrane 47 changes while the second membrane 48 has the second aperture 48 having a diameter of 50 nm in the inventive second mask 40 (Ni 50 nm/SiN 150 nm/Ni 150 nm). In FIG. 17, the abscissa axis is a diameter of the first aperture 47a, and the ordinate axis is the reference wave front deviation.

Referring to FIG. 17, it is understood that the reference wave front reduces when the diameter of the first aperture 47a maintains smaller than that of the second aperture 48a. One conventional problem is that a small aperture diameter increases the light intensity irradiated onto part other than the aperture, the light intensity that cannot be blocked by the part and leaks into the exit side, and the reference wave front deviation as a result of interference between the leaking light and the diffracted light from the aperture. On the other hand, the second mask 40 uses the multilayer membranes, such as the first membrane 47, the second membrane 48 and the third membrane 49, to reduce the unshielded, transmitting light, even when the aperture diameter reduces so as to reduce the influences of the optical axis offset and the wave front aberration of the incident light. Therefore, the influences of the optical axis offset and the wave front aberration of the incident light can be reduced. Even when the aperture is made of a slit, the reference wave front deviation reduces when the slit width of the first membrane 47 is smaller than that of the second membrane 48.

As discussed, the highly precise measurement is possible when the first mask 20 and the second mask 40 that can generate a reference wave front with a small error from the ideal wave front, for the reference wave front in an interferometer, such as a PDI and LDI, is used for measuring the wave front precision of the optical system and the surface precision of the optical element. Therefore, the measuring apparatus 1 can measure the optical performances of the optical system and the optical element that are required to have high precision.

In addition, the highly precise measurement of the wave front aberration caused by mounting the inventive measuring apparatus 1 onto an exposure apparatus maintains the stable exposure performance, and improves the yield of the semiconductor device and the maintainability.

Figure 18:
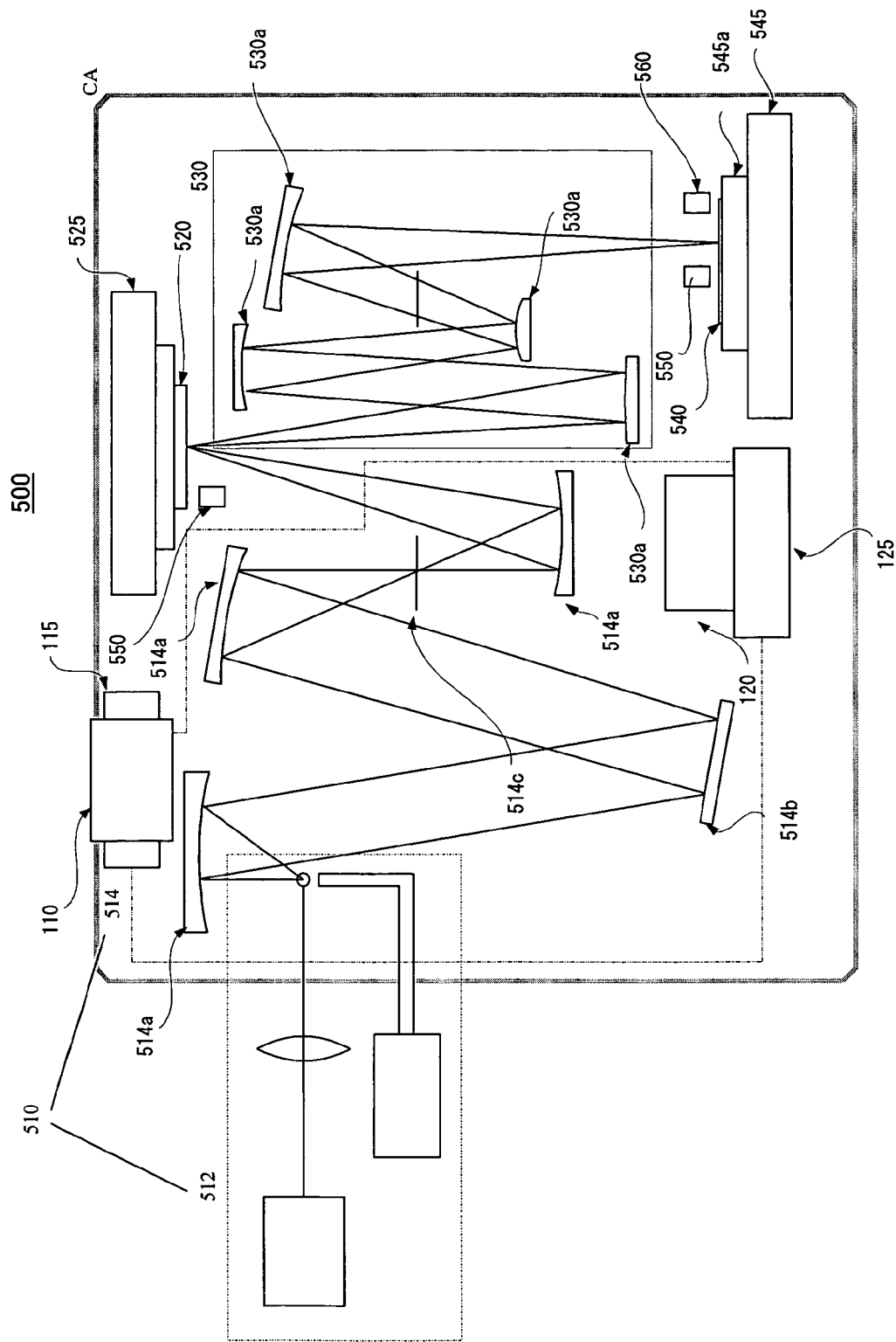
FIG. 18 is a schematic block diagram showing a structure of an exposure apparatus as one aspect of the present invention.

Referring now to FIG. 18, a description will be given of an exemplary exposure apparatus 500 that includes the inventive measuring apparatus 1. Here, FIG. 18 is a schematic block diagram showing a structure of the exposure apparatus 500 as one aspect of the present invention.

The inventive exposure apparatus 500 is a projection exposure apparatus that uses the EUV light, e.g., with a wavelength of 13.4 nm as illumination light to expose a circuit pattern of the reticle 520 onto the plate 540, e.g., in a step-and-repeat or a step-and-scan manner. Such an exposure apparatus is suitable for a submicron or quarter-micron lithography process, and this embodiment discusses a step-and-scan exposure apparatus (which is also called "a scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

Referring to FIG. 18, the exposure apparatus 500 includes the measuring apparatus 1, an illumination apparatus 510, a reticle 520, a reticle stage 525 mounted with the reticle 520, a projection optical system 530, an object to be exposed 540, a wafer stage 545 mounted with the object 540, an alignment detection mechanism 550, and a focus position detection mechanism 560.

As shown in FIG. 18, at least the optical path through which the EUV light travels (or the entire optical system) should preferably be maintained in a vacuum atmosphere, since the EUV light has low transmittance in air and causes contaminations when reacting with components of residual gas, such as oxygen, carbon dioxide, and water vapor.

The measuring apparatus 1 measures the optical performance of the projection optical system 530 in this embodiment. 110 in FIG. 18 denotes an illumination unit, mounted on a stage 115. 120 denotes a light receiving unit, mounted on a stage 125. In measuring the optical performance of the projection optical system 530, the illumination unit 110 and the light receiving unit 120 are driven for each stage, and replaced with the reticle 520 and the object 540. The light split from the illumination optical system 514 is introduced to the illumination unit 110, and used to measure the optical performance of the projection optical system 530. The measuring apparatus 1 can apply any of the above or other configurations, and a detailed description thereof will be omitted. Alternatively, instead of providing the exposure apparatus 500 with the measuring apparatus 1, the exposure apparatus 500 may utilize a projection optical system whose optical performance is greater than a predetermined value through a measurement by the measuring apparatus 1.

The illumination apparatus 510 uses the arc-shaped EUV light, for example, with a wavelength of 13.4 nm corresponding to an arc-shaped field of the projection optical system 530 to illuminate the reticle 520, and includes an EUV light source 512 and an illumination optical system 514.

The EUV light source 512 employs, for example, a laser plasma light source. It generates high temperature plasma by irradiating a pulsed laser beam with high intensity onto a target material in a vacuum chamber, and uses the EUV light, for example, with a wavelength of about 13 nm, which has been emitted from the plasma. The target material may use a metallic film, gas jets, liquid drops, etc. Preferably, the pulse laser is driven with a higher repetitive frequency of usually several kHz for increased average intensity of the radiated EUV light.

The illumination optical system 514 includes a condenser mirror 514a, and an optical integrator 514b. The condenser mirror 514a serves to collect the EUV light that is isotropically irradiated from the laser plasma. The optical integrator 514b serves to uniformly illuminate the reticle 520 with a predetermined NA. The illumination optical system 514 further includes an aperture 514c at a position conjugate with the reticle 520 to limit an illuminated area to an arc shape.

The reticle 520 is a reflection mask that has a circuit pattern or image to be transferred, and supported and driven by the reticle stage 525. The diffracted light from the reticle 520 is reflected by the projection optical system 530 and projected onto the object 540. The reticle 520 and the object 540 are arranged optically conjugate with each other. The exposure apparatus 500 is a scanner, and projects a reduced size of the pattern of the reticle 520 onto the object 540 by scanning the reticle 520 and the object 540.

The reticle stage 525 supports the reticle 520 and is connected to a moving mechanism (not shown). The reticle stage 525 may use any structure known in the art. A moving mechanism (not shown) may include a linear motor etc., and drives the reticle stage 525 at least in a direction X and moves the reticle 520. The exposure apparatus 500 assigns the direction X to scan the reticle 520 or the object 540, a direction Y perpendicular to the direction X, and a direction Z perpendicular to the reticle 520 or the object 540.

The projection optical system 530 uses plural multilayer membrane mirrors 530a to project a reduced size of the pattern of the reticle 520 onto the object 540. The number of mirrors 530a is about four to six. For a wide exposure area with the small number of mirrors, the reticle 520 and object 540 are simultaneously scanned to transfer a wide area that is an arc-shaped area or ring field apart from the optical axis by a predetermined distance. The projection optical system 530 has a NA of about 0.1 to 0.2. The inventive measuring apparatus 1 is applicable to a measurement of the optical performance, such as a wave front aberration, of the projection optical system 530. As a result of the measurement of the optical performance by the measuring apparatus 1, the projection optical system 530 having a measurement value in a permissible range is used for superior imaging performance. The optical performance of the projection optical system 530 is adjusted based on the measurement result of the measuring apparatus 1.

The instant embodiment uses a wafer as the object to be exposed 540, but it may include a liquid crystal plate and a wide range of other objects to be exposed. Photoresist is applied onto the object 540.

An object to be exposed 540 is held onto the wafer stage 545 by a wafer chuck 545a. The wafer stage 545 moves the object 540, for example, using a linear motor in XYZ directions. The reticle 520 and the object 540 are synchronously scanned. The positions of the reticle stage 525 and wafer stage 545 are monitored, for example, by a laser interferometer, and driven at a constant speed ratio.

The alignment detection mechanism 550 measures a positional relationship between the position of the reticle 520 and the optical axis of the projection optical system 530, and a positional relationship between the position of the object 540 and the optical axis of the projection optical system 530, and sets positions and angles of the reticle stage 525 and the wafer stage 545 so that a projected image of the reticle 520 may be positioned in place on the object 540.

The focus detection optical system 560 measures a focus position in the direction Z on the object 540 surface, and control over a position and angle of the wafer stage 545 may always maintain the object 540 surface at an imaging position of the projection optical system 530 during exposure.

The EUV light source 512 and the illumination optical system 514 in the illumination apparatus 510 in this embodiment may serve as the illumination optical system 10 in the measuring apparatus 1.

In exposure, the EUV light emitted from the illumination apparatus 510 illuminates the reticle 520, and images a pattern of the reticle 520 onto the object 540 surface. This embodiment uses an arc or ring shaped image plane, scans the reticle 520 and object 540 at a speed ratio corresponding to a reduction ratio to expose the entire surface of the reticle 520. The exposure apparatus 500 uses the projection optical system 530 whose optical performance is greater than a predetermined value through a measurement of the measuring apparatus 1, realizes superior exposure performance, and provides devices (e.g., a semiconductor device, a LCD device, an image pickup device (such as a CCD), and a thin film magnetic head) with good throughput and economical efficiency.

Figure 19:
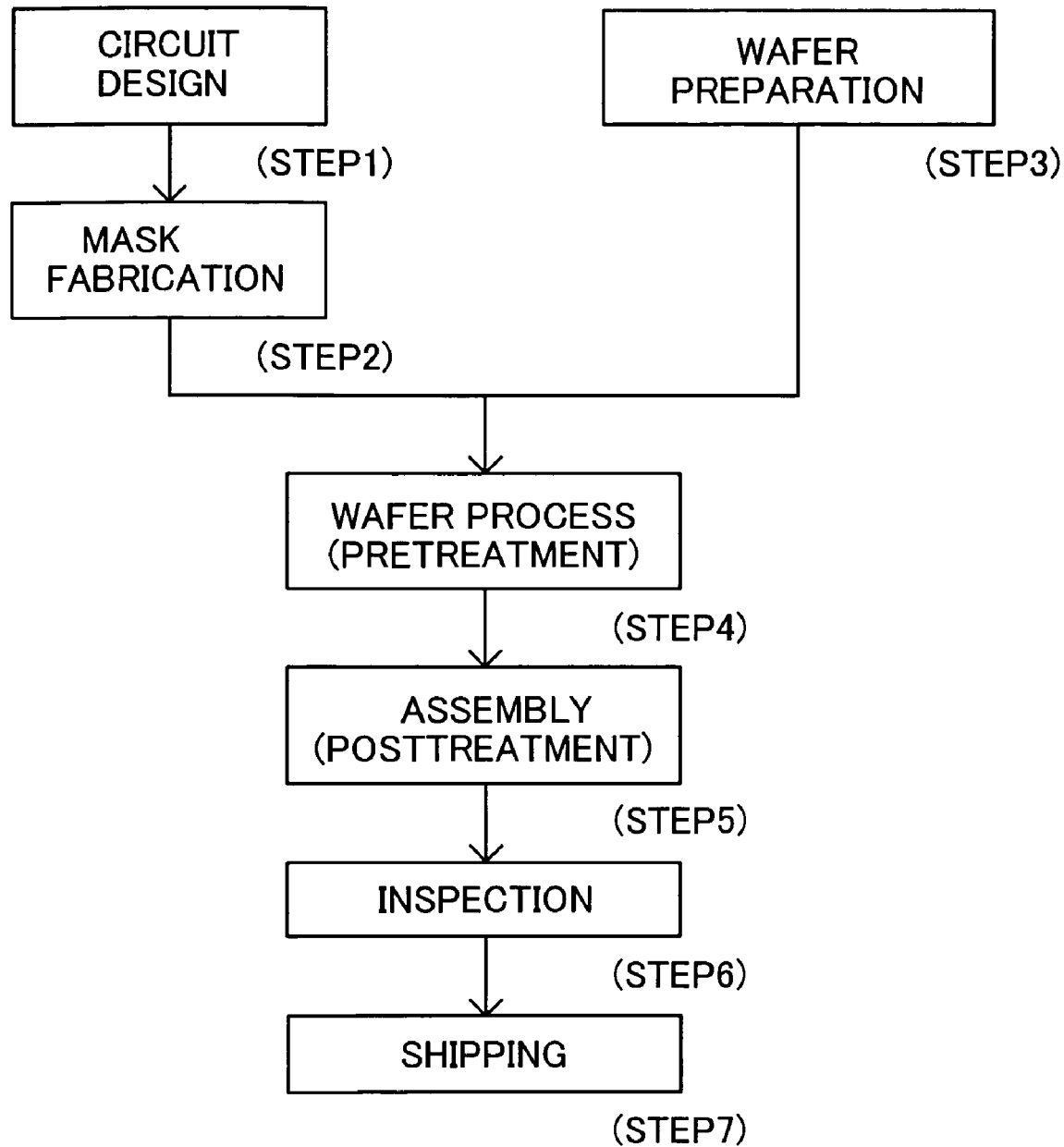
FIG. 19 is a flowchart for explaining a method for fabricating devices (semiconductor chips such as ICs, LSIs, and the like, LCDs, CCDs, etc.).
Figure 20:
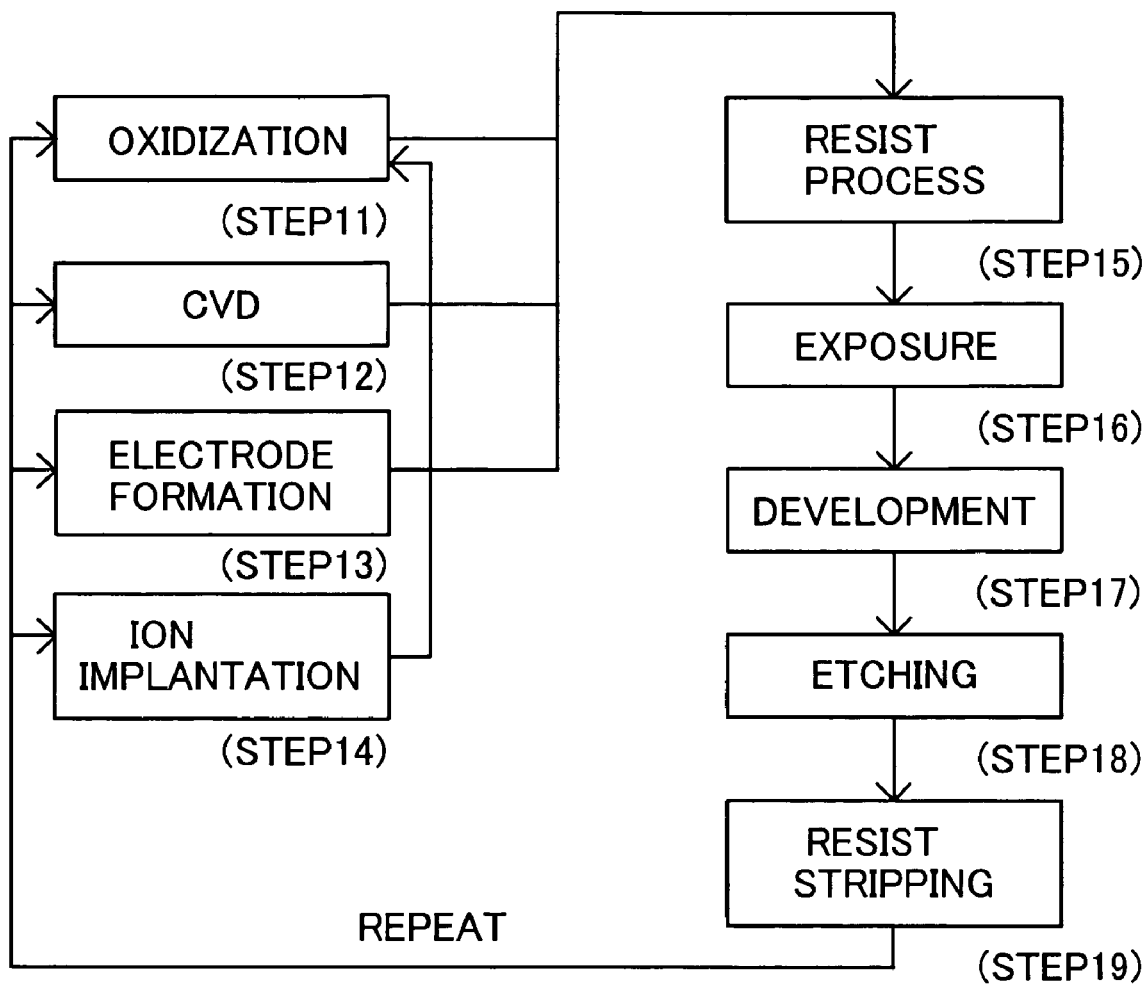
FIG. 20 is a detailed flowchart for Step 4 of wafer process shown in FIG. 19.

Referring now to FIGS. 19 and 20, a description will now be given of an embodiment of a device manufacturing method using the above exposure apparatus 500. FIG. 19 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 20 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 500 to expose a reticle pattern onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. This embodiment can provide higher-quality semiconductor devices than the prior art. Thus, the device manufacturing method that uses the exposure apparatus 500, and its resultant (intermediate and final) products also constitute one aspect of the present invention.

Furthermore, the present invention is not limited to these preferred embodiments and various variations and modifications may be made without departing from the scope of the present invention.

As discussed, the present invention can provide not only a measuring apparatus that reduces an error between the ideal wave front and the reference wave front generated by the fine aperture, and precisely measures the optical performance, such as a wave front aberration, of an optical system, but also an exposure apparatus having the measuring apparatus.

This application claims a foreign priority benefit based on Japanese Patent Applications No. 2004-126049, filed on Apr. 21, 2004, which is hereby incorporated by reference herein in its entirety as if fully set forth herein.

What is claimed is:

1. A measuring apparatus for measuring optical performance of a test optics by using light, said measuring apparatus comprising:
    a first member for generating a first ideal wave front;
    a second member for generating a second ideal wave front and a test wave front that reflects the optical performance of the test optics; and
    a detector for detecting an interference fringe between the test wave front and the second ideal wave front that passes said second member,
    wherein said first member and/or said second member include:
    a first membrane having a first aperture for diffracting the light; and
    a second membrane having a second aperture for diffracting the light that has passed the first aperture, the second membrane being spaced from the first membrane so that the first and second apertures overlap each other.

2. A measuring apparatus according to claim 1, further comprising a spacer for maintaining a space between first and second membranes.

3. A measuring apparatus according to claim 1, wherein the first and second apertures have a slit or circular shape.

4. An exposure apparatus for exposing a pattern of a reticle onto an object, said exposure apparatus comprising a projection optical system for projecting the pattern onto the object, optical performance of said projection optical system which has been measured by a measuring apparatus according to claim 1 having a predetermined value.

5. An exposure method comprising the steps of:
    calculating optical performance of a projection optical system using a measuring apparatus according to claim 1;
    adjusting the projection optical system based on the optical performance of the projection optical system, which is calculated by said calculating step; and
    exposing an object using an exposure apparatus that includes the projection optical system adjusted by said adjusting step.

6. A device manufacturing method comprising the steps of:
    exposing an object using an exposure apparatus; and
    developing the object that has been exposed,
    wherein said exposure apparatus includes a projection optical system for projecting the pattern onto the object, optical performance of said projection optical system which has been measured by a measuring apparatus according to claim 1 having a predetermined value.

7. A measuring apparatus for measuring optical performance of a test optics by using light, said measuring apparatus comprising:
    a first member for generating a first ideal wave front;
    a second member for generating a second ideal wave front and a test wave front that reflects the optical performance of the test optics; and a detector for detecting an interference fringe between the test wave front and the second ideal wave front that passes said second member, wherein said first member and/or said second member include:

a first membrane having a first aperture for diffracting the light;

a second membrane having a second aperture for diffracting the light that has passed the first aperture; and a third membrane for introducing the light that has passed the first aperture to the second aperture, the third membrane being arranged between the first and second membranes, and connecting the first and second apertures so that the first and second apertures overlap each other, wherein $k_1 > k_3$ and $k_2 > k_3$ are met, where $k_1$ is an extinction coefficient of the first membrane, $k_2$ is an extinction coefficient of the second membrane, and $k_3$ is an extinction coefficient of the third membrane.

8. A measuring apparatus according to claim 7, wherein a center of the first aperture accords with a center of a second aperture.

9. A measuring apparatus according to claim 7, wherein the first and second apertures have a slit or circular shape.

10. A measuring apparatus according to claim 7, wherein the first and second apertures have a slit shape with a width of $\lambda/NA$ or smaller, where $\lambda$ is a wavelength of the light, and NA is a numerical aperture of the test optics.

11. A measuring apparatus according to claim 7, wherein the first and second apertures have a circular shape with a diameter of $1.22 \cdot \lambda/NA$ or smaller, where $\lambda$ is a wavelength of the light, and NA is a numerical aperture of the test optics.

12. A measuring apparatus according to claim 7, wherein a thickness of the third membrane is $n \cdot a^2/(4\lambda)$ or greater, where $\lambda$ is a wavelength of the light, a is a maximum width of a width of the third membrane, and n is a real part of a complex index of refraction.

13. A measuring apparatus according to claim 7, wherein a thickness of the first membrane is $\lambda/(2\pi k_1)$ or greater, where $\lambda$ is a wavelength of the light.

14. A measuring apparatus according to claim 7, wherein a thickness of the second membrane is $1.727\lambda/(\pi k_2)$ or greater, where $\lambda$ is a wavelength of the light.

15. A measuring apparatus according to claim 7, wherein the first aperture of the first membrane and the second aperture of the second membrane have a slit shape, and wherein a width of the slit shape of the first aperture is smaller than that of the third aperture.

16. A measuring apparatus according to claim 7, wherein the first aperture of the first membrane and the second aperture of the second membrane have a circular shape, and wherein a diameter of the circular shape of the first aperture is smaller than that of the second aperture.

17. An exposure apparatus for exposing a pattern of a reticle onto an object by using light from a light source, said exposure apparatus comprising:

a projection optical system for projecting the pattern onto the object; and a measuring apparatus according to claim 1 for measuring optical performance of said projection optical system using the light.

18. An exposure apparatus for exposing a pattern of a reticle onto an object by using light from a light source, said exposure apparatus comprising:

a projection optical system for projecting the pattern onto the object; and a measuring apparatus according to claim 7 for measuring optical performance of said projection optical system using the light.

19. An exposure apparatus according to claim 18, further comprising an illumination optical system for illuminating the reticle, said illumination optical system serving as part of said measuring apparatus.

20. A measuring apparatus for measuring optical performance of a test optics by using light, said measuring apparatus comprising:

a member that includes a first membrane having a first aperture for generating an ideal wave front from the light, and a second membrane having a second aperture for generating an ideal wave front from the light that has passed the first aperture, the second membrane being spaced from the first membrane so that the first and second apertures overlap each other; and a detector for detecting an interference fringe between the ideal wave front that passes the second aperture and the test wave front that reflects the optical performance of the test optics.

21. A measuring apparatus for measuring optical performance of a test optics by using light, said measuring apparatus comprising:

a member that includes a first membrane having a first aperture for generating an ideal wave front from the light, a second membrane having a second aperture for generating an ideal wave front from the light that has passed the first aperture, and a third membrane for introducing the light that has passed the first aperture to the second aperture, the third membrane being arranged between the first and second membranes, and connecting the first and second apertures so that the first and second apertures overlap each other; and a detector for detecting an interference fringe between the ideal wave front that passes the second aperture and the test wave front that reflects the optical performance of the test optics, wherein $k_1 > k_3$ and $k_2 > k_3$ are met, where $k_1$ is an extinction coefficient of the first membrane, $k_2$ is an extinction coefficient of the second membrane, and $k_3$ is an extinction coefficient of the third membrane.

* * * * *